US010613785B1

(12) United States Patent
Beskales et al.

(10) Patent No.: US 10,613,785 B1
(45) Date of Patent: Apr. 7, 2020

(54) SCALABLE BINNING FOR BIG DATA DEDUPLICATION

(71) Applicant: Tamr, Inc., Cambridge, MA (US)

(72) Inventors: George Beskales, Waltham, MA (US); Ihab F. Ilyas, Waterloo (CA)

(73) Assignee: Tamr, Inc., Cambridge, MA (US)

( * ) Notice: Subject to any disclaimer, the term of this patent is extended or adjusted under 35 U.S.C. 154(b) by 246 days.

(21) Appl. No.: 15/729,980

(22) Filed: Oct. 11, 2017

Related U.S. Application Data

(60) Provisional application No. 62/415,095, filed on Oct. 31, 2016.

(51) Int. Cl.
| | |
|---|---|
| *G06F 7/02* | (2006.01) |
| *G06F 16/00* | (2019.01) |
| *G06F 3/06* | (2006.01) |
| *G06F 16/903* | (2019.01) |
| *G06F 16/174* | (2019.01) |
| *G06F 16/906* | (2019.01) |

(52) U.S. Cl.
CPC ...... *G06F 3/0641* (2013.01); *G06F 16/90344* (2019.01); *G06F 16/1748* (2019.01); *G06F 16/906* (2019.01)

(58) Field of Classification Search
CPC .. G06F 16/1748; G06F 3/0608; G06F 3/0641; G06F 16/31; G06F 16/353; G06F 16/906
See application file for complete search history.

(56) References Cited

U.S. PATENT DOCUMENTS

| | | | |
|---|---|---|---|
| 8,645,399 B2 | 2/2014 | McNeill et al. | |
| 8,914,338 B1 | 12/2014 | Wallace et al. | |
| 9,075,818 B2 | 7/2015 | Cavage et al. | |
| 9,268,863 B2 | 2/2016 | Buyuktosunglu et al. | |
| 9,280,551 B2 | 3/2016 | Chambliss et al. | |
| 9,514,146 B1* | 12/2016 | Wallace | G06F 16/24561 |
| 2014/0156606 A1* | 6/2014 | Beskales | G06F 16/215 707/692 |
| 2016/0267610 A1* | 9/2016 | Corbett | G06F 16/215 |
| 2017/0091320 A1* | 3/2017 | Psota | G06F 16/35 |
| 2018/0121820 A1* | 5/2018 | Manasse | G06K 9/6215 |

OTHER PUBLICATIONS

Wang, Li, and Feng, Can we Beat the Prefix Filtering? An Adaptive Framework for Similarity Join and Search, Sigmod '12, May 2012, Scottsdale, Arizona.

(Continued)

*Primary Examiner* — Bruce M Moser (74) *Attorney, Agent, or Firm* — Panitch Schwarze Belisario & Nadel LLP (57) ABSTRACT

A very efficient computer system is presented to generate all pairs of records that have a certain similarity. Similarity is defined in terms of the textual similarity of the record attributes and/or absolute difference for numeric record attributes. Software assigns each record to a number of bins, and then compares pairs of records that belong to the same bin. This is more efficient than comparing all pairs of records since the number of records compared to each other is much smaller.

10 Claims, 3 Drawing Sheets

(56) References Cited

OTHER PUBLICATIONS

Bhagwat, Eshghi, Long, and Lillibridge, Extreme Binning: Scalable, Parallel Deduplicaton for Chunk-based File Backup, IEEE International Symposium on Modeling, Analysis & Simulation of Computer and Telecommunication Systems, 2009, London, UK.

Zhang, Bhagwat, Litwin, Long, and Schwarz, Improved Dedpulication through Parallel Binning, IEEE 31st International Performance Computing and Communications Conference, Dec. 2012, Austin, Texas.

Anastasiu and Karypis, L2AP: Fast Cosine Similarity Search With Prefix L-2 Norm Bounds, IEEE 30th International Conference on Data Engineering, Apr. 2014, Chicago, Illinois.

Bayardo, Ma, and Srikant, Scaling Up All Pairs Similarity Search, WWW 2007, May 2007, Bannff, Alberta, Canada.

Lyas and Chu, Trends in Cleaning Relational Data: Consistency and Deduplication, Foundations and Trends in Databases, 2015, vol. 5 No. 4, pp. 281-393, Hanover, Massachusetts.

\* cited by examiner

SCALABLE BINNING FOR BIG DATA DEDUPLICATION

CROSS-REFERENCE TO RELATED APPLICATIONS

This utility patent application claims priority from U.S. provisional patent application Ser. No. 62/415,095, filed Oct. 31, 2016, titled "Scalable Binning for Big Data Deduplication", naming inventors George Beskales and Ihab F. Ilyas.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright 2017 Tamr.

BACKGROUND

Field of Technology

This is related to computer databases, and more particularly to detecting and merging duplicate records during database integration.

Background

Enterprises with large data repositories (e.g., customer database, product categories, company information, etc.) face challenges needing data deduplicated, often as a result of integration of data from multiple sources. Due to extremely large scale of the number of data records involved, existing deduplication solutions have shortcomings in performance and processing time needed.

Description of Prior Art

"Extreme Binning: Scalable, Parallel Deduplication for Chunk-based File Backup" Bhagwa et al., Modeling, Analysis & Simulation of Computer and Telecommunication Systems, 2009. This paper focuses on finding chucks of files that are exact duplicates. This will not find similarities, such as the same file with minor variations, and the method (min hash) can possibly lead to false negatives (i.e., undetected duplicates).

"Improved Deduplication through Parallel Binning", Zhang et al., In Performance Computing and Communications Conference (IPCCC) 2012. This is an improvement of the paper titled "Extreme Binning: Scalable, Parallel Deduplication for Chunk-based File Backup."

"Can We Beat the Prefix Filtering? An Adaptive Framework for Similarity Join and Search", Wang et al., SIGMOD '12, May 20-24, 2012, Scottsdale, Ariz., USA. This paper indexes database records, and allows finding records that have similarity above a predefined threshold. However, this paper is limited to similarity functions that have all tokens in the records equally weighted.

"Scaling up all pairs similarity search", Bayardo et al., WWW 2007, May 8-12, 2007, Banff, Alberta, Canada. This paper addresses the same problem of finding all pairs of records with similarity above a certain threshold, but uses single tokens for index keys.

"L2AP: Fast Cosine Similarity Search With Prefix L-2 Norm Bounds.", Anastasiu and Karypis, 30$^{th}$ IEEE International Conference on Data Engineering (ICDE), 2014. This is an optimized version of "Scaling up all pairs similarity search."

U.S. Patents

U.S. Pat. No. 8,645,399 (issued Feb. 4, 2014, naming inventors McNeill et al., titled "Dynamic record blocking") performs recursive blocking of input records with the stopping criterion being block size is less than a certain threshold. The algorithm considers all possible ways to refine each oversized block, and selects the one that results in the target size. This uses exact matching of record attributes (e.g., first name, SSN) to perform blocking, so will not match if same records exist with minor variations.

U.S. Patent Application Publications

United States Patent Application Publication 2015/0278241 (published Oct. 1, 2015, naming inventors Bates-Haus et al., titled "Method and system for large scale data curation"), which is hereby incorporated by reference, discloses a system for solving a database integration problem, but does not address specific techniques to obtain candidate record pairs. The techniques and improvements discussed below can be used in a system such as disclosed by Bates-Haus.

None of the above provides a system to maximize efficiency in identifying all similar record pairs in a given data set given a similarity function. What is needed, therefore, is a system that overcomes the above-mentioned limitations and that includes the features enumerated above.

BRIEF SUMMARY

The problem of duplicate elimination is to detect all pairs of records in a given data set that are highly similar, according to some similarity function. One of the main challenges is to obtain all similar record pairs, according to some similarity function, without exhaustive enumeration of all record pairs. Binning is the process of assigning the input records to (possibly overlapping) bins such that all similar record pairs appear in the same bin. All record pairs that belong to different bins can then be pruned. This allows a computer system for computationally faster data deduplication.

The system operates software which takes data records having many attributes and produces different Bin IDs after scanning the data and applying statistics and pre-analysis to identify all building blocks (e.g., terms, q-grams, ranges, etc.). The software uses: local similarity functions, which take an attribute and a local threshold as parameters; a global similarity aggregation function, which takes a pair of records as parameters; a global threshold; and a budget of allowed false negatives; to generate pairs of records called Global Candidate Pairs such that the number of record pairs not in the set of Global Candidate Pairs and their global similarity is above the global threshold and within the budget of allowed false negatives. The list of Global Candidate Pairs is filtered for deciding on duplicate pairs through use of classifiers and/or human experts.

The Global Candidate Pairs may be generated by aggregating pairs of records called Local Candidate Pairs, which are candidate pairs according to a local similarity function (based on one attribute) by translating the global threshold to appropriate values of the thresholds of each local similarity function to guarantee the budget of allowed false negatives is not exceeded. The Local Candidate Pairs are then aggregated to produce the Global Candidate Pairs, such as by a union aggregation. Assignment of the local thresholds depends on the global similarity aggregation function. As an example of a simple maximum aggregation of local similarity functions, assigning the local thresholds to the global threshold is a valid assignment.

For string or text attributes, building block may be extracted from each string or sequence of text, and mapped to a global pre-defined order based on importance in the text (e.g., TF-IDF variants, frequency, co-occurrence, etc.). For each record scanned when extracting building blocks, representative subsets of building blocks (e.g., token or Q-grams) may be extracted as Bin IDs. Any two records which share at least one of these Bin IDs will be a Local Candidate Pair. This may be tuned to produce only the Bin IDs which are necessary to guarantee that the number of pairs of records that are not Local Candidate Pairs with within the false negative budget.

For numerical attributes, each value may be mapped to a number of Bin IDs to ensure that any pair of values with distance below the specified threshold belong to the same bin.

Local candidates of each local similarity function may be generated from the local bins of records, for example by a Cartesian product of all the records in the same local bin.

Local candidates may be aggregated to produce Global Candidates by applying a Boolean formula (e.g., in disjunctive normal form, DNF) of local similarity functions on attributes, optionally involving the same attribute in multiple local similarity predicates to specify global candidate generation criteria in terms of local candidate generation criteria. ANDed candidate generation criteria may be implemented by computing each local candidate set separately, and the global candidate set is obtained by intersecting all local candidate sets. ORed candidate generation criteria may be implemented by computing each local candidate set separately, and the global candidate set is obtained by unioning all local candidate sets. ORing and ANDing of candidate generation criteria can be interleaved by applying ANDed candidate generation and ORded candidate generation in a bottom-up fashion.

Features and Advantages

The system supports any similarity function that takes weighted tokens as an input.

The system is highly efficient. It significantly outperforms previous solutions, and scales up to millions of records.

The system can work either as a single machine, or as a cluster of machines (e.g., Hadoop or Spark cluster). This allows much shortened execution time through parallelization of the computation.

BRIEF DESCRIPTION OF THE DRAWINGS

In the drawings, closely related figures and items have the same number but different alphabetic suffixes. Processes, states, statuses, and databases are named for their respective functions.

DETAILED DESCRIPTION, INCLUDING THE PREFERRED EMBODIMENT

In the following detailed description, reference is made to the accompanying drawings which form a part hereof, and in which are shown, by way of illustration, specific embodiments which may be practiced. It is to be understood that other embodiments may be used, and structural changes may be made without departing from the scope of the present disclosure.

Terminology

The terminology and definitions of the prior art are not necessarily consistent with the terminology and definitions of the current invention. Where there is a conflict, the following definitions apply.

Local Similarity Function: a function to measure the similarity of two values that belong to the same attribute.

False Negatives Budget: The maximum number of similar record pairs that can be absent from the generated candidate pairs.

Disjunctive Normal Form: A specific form of Boolean formula that is represented as multiple ORed clauses, each of which is represented by ANDed atomic predicates.

Local Candidate Pairs: A set of record pairs that have local similarity function above a certain threshold.

Global Candidate Pairs: A set of record pairs that are obtained by aggregating multiple local candidate pair sets.

Bin of Records: A set of records that are possibly pairwise similar.

Bin ID: A unique identifier of a bin of records.

Operation

Binning is the process of assigning the input records to (possibly overlapping) bins such that all similar record pairs appear in the same bin. All record pairs that belong to different bins can be pruned.

Input

A set of values $D=\{v\_1, \ldots v\_n\}$ where each value $v\_i$ is represented as a (multi)set of elements denoted $\{e\_i1, \ldots, e\_in\}$. Possible methods to split each value $v\_i$ to elements include tokenization and q-gramming. The exact split method to use depends on the desired granularity of the similarity computation. For example, if word-level similarity is required, tokenization should be used. Alternatively, if character-level similarity is required, q-gramming should be used.

A similarity function $sim(v\_i, v\_j)$. For example, cosine similarity, Jaccard similarity, Dice similarity.

A similarity threshold T in range [0, 1].

Output

For each value $v\_i$, the corresponding bin IDs, denoted $B(v\_i)$, are output such that $sim(v\_i, v\_j)$ implies $B(v\_i) \cap B(v\_j)$ is not empty.

Let $O=\{e\_1, \ldots, e\_m\}$ be a total ordering on all unique elements in $v\_1 \cup \ldots \cup v\_n$. Although the total ordering does not affect the correctness of the algorithm (i.e., no false negatives), it does affect the pruning power of the binning criteria. One efficient ordering is based on the increasing frequency of element occurrences in the data set (ties are broken arbitrarily).

A search state $S\_i$ is a mapping from each element in O to $\{0, 1, ?\}$. An element mapped to 0 indicates the absence of that element in the intersection of two sets $v\_i, v\_j$. Mapping to 1 indicates the presence of such an element. Mapping to ? indicates either absence or presence of the element. $P(S\_i)$ is the elements in $S\_i$ that are mapped to 1. $N(S\_i)$ indicates the elements in $S\_i$ that are mapped to 0. $D(S\_i)$ are the elements on $S\_i$ that are mapped to ?.

For a given element set $v\_i$, the benefit of a state $S\_k$ is the best similarity between $v\_i$ and any other element set $v\_j \subseteq O$ such that $v\_i \cap v\_j = P(S\_k)$. That is, benefit($v\_i$, $S\_k$)=Max$_{v\_j:v\_i \cap v\_j=P(S\_k)}$ sim($v\_i$, $v\_j$)

A goal state satisfies benefit($v\_i$, $S\_k$)>=T.

A benefit upper bound is obtained by assuming that elements in D($S\_k$) belong to $v\_i \cap v\_j$:

$\overline{\text{benefit}}$($v\_i$, $S\_k$)=Max$_{v\_j:v\_i \cap v\_j=P(S\_k) \cup D(S\_k)}$ sim($v\_i$, $v\_j$)

The benefit function and its upper bound can easily be computed for various monotone similarity functions such as cosine similarity and Jaccard similarity. For example, for cosine similarity, assume that each element e in $v\_i$ is associated with a normalized weight w(e). Additionally, each element e is associated with mw(e), which is the maximum weight associated with term e across all values $v\_1, \ldots, v\_n$.

A value $v\_i$ and a state $S\_k$ has the following upper and lower bounds:

benefit($v\_i$, $S\_k$)=Min(($\Sigma_{e \in v\_i \cap P(S\_k)}$ w(e)$^2$)$^{1/2}$, $\Sigma_{e \in v\_i \cap P(S\_k)}$ w(e) mw(e))

$\overline{\text{benefit}}$($v\_i$, $S\_k$)=Min(($\Sigma_{e \in v\_i \cap (P(S\_k) \cup D(S\_k))}$ w(e)$^2$)$^{1/2}$, $\Sigma_{e \in v\_i \cap (P(S\_k) \cup D(S\_k))}$ w(e) mw(e))

State S is represented as a triple (P, N, D) where P is the set of elements mapped to 1, N is the set of elements mapped to 0, and D is the set of elements mapped to ?. Since the union of P, N, and D is always equal to the set of all elements $\{e\_1, \ldots, m\}$, the set N can be omitted and S represented using (P, D) only.

Figure 1:
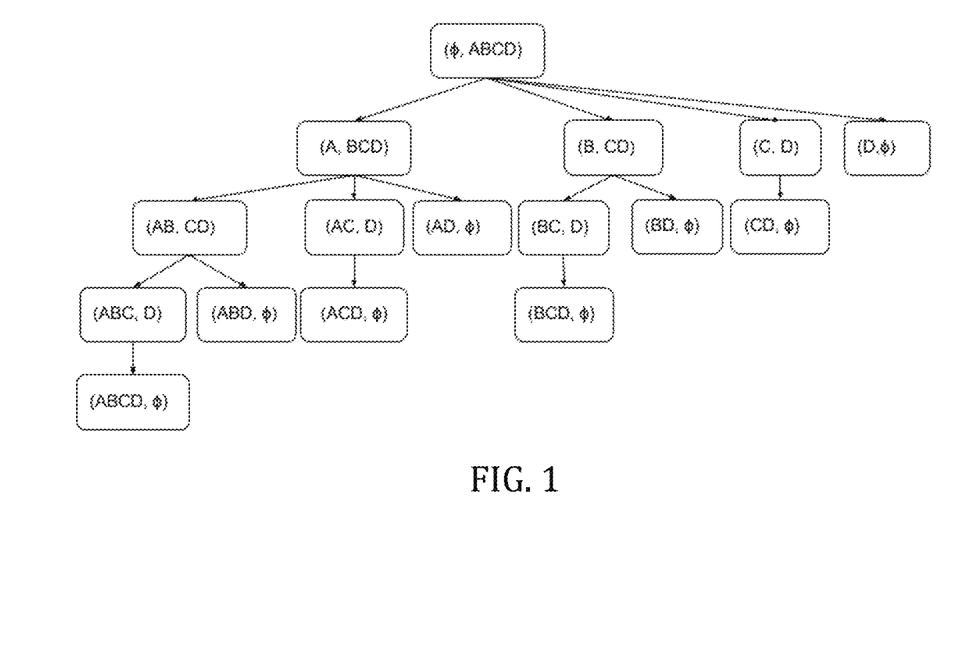
FIG. 1 depicts the search space for an example record containing tokens {A, B, C, D}.

The FIG. 1 tree shows the search space for a value containing elements $\{A, B, C, D\}$, assuming that the global ordering O is $\{A, B, C, D, E, F\}$.

For example, (AC, D) represents a state where A and C are mapped to 1, B, E, and F are mapped to 0, and D is mapped to ?. Also, (BD, Ø) represents a state where B and D are mapped to 1, A, C, E, and F are mapped to 0, and nothing is mapped to ?.

Pseudo-code for binning a value (A*-search):

Algorithm 1: bin_text_value ($v_i$, O, benefit, $\overline{\text{benefit}}$, τ)

Require: $v_i$: the value to be binned, consisting of elements ($T\_1, \ldots, T\_k$)

Require: O: a total order on all terms

Require: benefit: a function to compute benefit of a state

Require: $\overline{\text{benefit}}$: a function to compute a benefit upper bound of a state 1: B($v_i$)←Ø
2: let PQ be a priority queue that contains search states ordered descendingly on $\overline{\text{benefit}}$
3: push state S=(Ø, $v_i$) into PQ with score $\overline{\text{benefit}}$($v_i$,S)=1
4: while PQ is not empty do
5: pop the top state S from PQ
6: if ($\overline{\text{benefit}}$($v_i$,S)<τ) then
7: break
8: else if (benefit(S)≥x) then
9: add S to B($v_i$)
10: else
11: for each element $T_i \in D(S)$ such that the index i is greater than the index of the last term in P(S) based on O do
12: S'←(P(S)∪$\{T_i\}$, $\{T_{i+1}, \ldots, T_k\}$)
13: push S' into PQ with score $\overline{\text{benefit}}$($v_i$,S')
14: end for
15: end if
16: end while
17: return B($v_i$)

Algorithm 1 provides the smallest number of distinct candidates (i.e., after unioning the candidates coming from all bins). However, the number of candidates before the union step can be large. This is mainly because the algorithm emits the longest states with benefit >=T, which might be deep in the search space. The number of these states can be very large, and a given candidate pair is going to appear in a possibly large number of bins.

In order to reduce the number of candidates, another stopping criterion is introduced: freq($S\_i$)<freq_threshold, where freq(.) indicates the co-occurrence frequency of elements in $S\_i$ in the data set, and freq_threshold is a relatively small value (e.g., 0.1%). Computing the exact value of freq($S\_i$) is prohibitively expensive, especially if the size of $S\_i$ is arbitrarily long. Possible heuristics are:

1: freq($S\_i$)=$\Pi_{e \in S\_i}$freq(e) (assuming independence)
2: freq($S\_i$)=min$_{e \in S\_i}$freq(e) (upper bound)

Another heuristic is to limit the size of P($S\_i$) to, e.g., 3 elements.

The algorithm is modified to:

Algorithm 2: bin_text_value_prune ($v_i$,O,benefit, $\overline{\text{benefit}}$,τ,freq$_{threshold}$)

Require: $v_i$: the value to be binned, consisting of elements ($T\_1, \ldots, T\_k$)

Require: O: a total order on all terms

Require: benefit: a function to compute benefit of a state

Require: $\overline{\text{benefit}}$: a function to compute a benefit upper bound of a state Require: freq$_{threshold}$: a cut-off threshold for freq(S)

1: B($v_i$)←Ø
2: let PQ be a priority queue that contains search states ordered descendingly on $\overline{\text{benefit}}$
3: push state S=(Ø, $v_i$) into PQ with score $\overline{\text{benefit}}$($v_i$,S)=1
4: while PQ is not empty do
5: pop the top state S from PQ
6: if ($\overline{\text{benefit}}$($v_i$,S)<τ) then
7: break
8: else if (freq(S)<freq$_{threshold}$)OR (benefit($v_i$,S)≥τ) then
9: add S to B($v_i$)
10: else
11: for each element $T_i \in D(S)$ such that the index i is greater than the index of the last term in P(S) based on O do
12: S'←(P(S)∪$\{T_i\}$, $\{T_{i+1}, \ldots, T_k\}$)
13: push S' into PQ with score $\overline{\text{benefit}}$($v_i$,S')
14: end for
15: end if
16: end while
17: return B($v_i$)

For example, in FIG. 1, assume that (ABC, D) and (ABD, Ø) satisfy benefit >=T. Assuming that elements A and B occur rarely in the data set, emit (AB, CD) instead of (ABC, D) and (ABD, Ø). Note that freq($S\_i$) depends only on the state and it does not depend on the element being binned. This ensures that the bin IDs are emitted in a consistent way among all element sets and hence no false negatives are introduced.

Approximate Binning

Algorithms 1 and 2 are guaranteed to have zero false negatives (i.e., no missed matching pair). However, a user may be able to tolerate a small number of false negatives (e.g., <1% of true candidates) in return for faster computation of candidates. This can be achieved by multiplying benefit($v_i$,S) and score $\overline{\text{benefit}}$($v_i$,S) by a constant c<1.0 (e.g., 0.95). Alternatively, redefine mw(e) to be the 95$^{th}$ percentile of weights assigned to e across all values instead of the maximum weight. These two relaxations result in less than 1% false negatives when applied on various data sets (e.g., DBLP, Twitter, US spending).

Binning Numeric Values

Given a threshold T, the numeric binner divides the attribute domain into two sets of bins, where the length of each bin is equal to 2*T, the bins within each set are disjoint, and the bins in both sets are interleaved with overlap equal to threshold. Specifically, the first set of bins is { ..., [0, 2T), [2T, 4T), [4T, 6T), The second set of bins is { ..., [T, 3T), [3T, 5T), [5T, 7T), ... }. Each bin in the two lists is given a unique ID. For example, the bins in the first set are assigned to IDs { ..., 0, 2, 4, ... }, and the bins in the second set are assigned to IDs { ..., 1, 3, 5, ... }.

Each value is mapped to exactly two bin IDs: one from each set.

The following equations compute the two bin IDs for each numeric value $V\_i$:

$$B\_1(V\_i, T) = 2 \text{ floor}(V\_i/(2T))$$

$$B\_2(V\_i, T) = 2 \text{ floor}((V\_i+T)/2T)+1).$$

Figure 2:
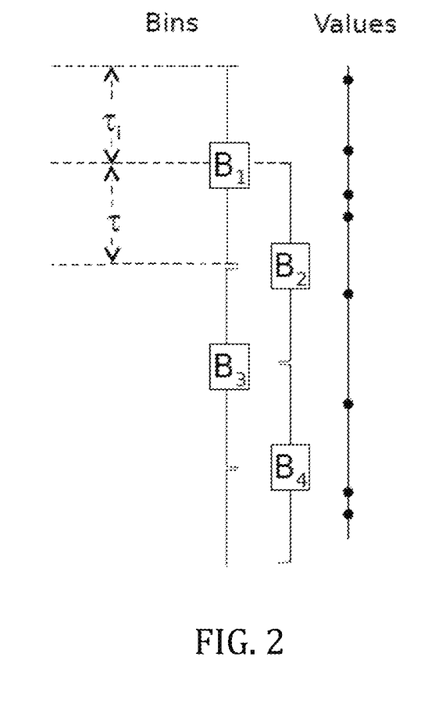
FIG. 2 depicts the space partitioning of a numeric attribute domain into overlapping bins.

FIG. 2 depicts an example of partitioning the space based on these equations.

Any two values with distance <=T will necessarily belong to the same bin.

Use in Improved Computing Systems

The binning algorithms detailed above may be implemented in computing systems to enable improved and computationally faster data deduplication. A computing system may be any single or multiple processor machine, or multiple network connected machines, with data input and output capabilities. Input can be direct, such as through disk, keyboard, or mouse, or indirect, such as over a network through an application programming interface (API) or webpage driven interface. Output may similarly be direct, such as display on a connected screen, or indirect such as written to disk or database for later or remotely connected access. A computing system may also be a virtual computing environment operating on top of physical hardware, such as within cloud platform computing.

The computing system receives as input data records with multiple attributes. One example is US census data which contains hundreds of millions of records each of which contains tens of fields. Another example is a publications database such as DBLP, which contains tens of millions of publications, each of which contains tens of fields. The data records can come from any source, such as text files, databases, or other data repositories, as long as they are resolved into individual records having multiple attributes.

Data deduplication is removal of duplicate or equivalent records within the set of input data records. Deduplication software running on the computer system scans the input data records and generates different Bin IDs using statistics and pre-analysis such as inverse document frequency (IDF), which is the logarithm of the total number of records over the number of records containing a specific term. The Bin IDs cover a list of building blocks based on the data records. For example, building blocks may be, but are not limited to, terms, q-grams, or ranges, based on the type of content in the data records. Choosing which building blocks to use depends on the granularity of the similarity function that the user needs. For example, if the user is interested in word-level similarity, the building blocks are the words occurring in each value. If the user is interested in character-level similarity function, the building blocks are q-grams of the values. Data records may be input to the deduplication software by selecting or otherwise identifying a source, such as a file location or database, through a graphical or textual user interface, input by file, or input from another program through an API.

The deduplication software also takes local similarity functions ($L\_1, \ldots, L\_k$), local thresholds ($T\_1, \ldots, T\_k$), and a global similarity aggregation function (A). For example, one may union two local candidate pair sets coming from (first name similarity >0.9) and (last name similarity >0.8) to obtain a set of global candidate pairs. These inputs can be typed or selected through a graphical user interface, input through one or more files read by the deduplication software, or input through an API. The local similarity function must take parameters of an attribute and a local threshold.

The deduplication software generates all candidate pairs, called Global Candidate Pairs. The list of Global Candidate Pairs is sent later for a final filtering step of deciding on duplicate pairs by running candidate pairs through classifiers. Such classifiers are (potentially computationally expensive) methods that determine with high accuracy whether a candidate pair is a true duplicate or not. The overall time consumed by the classifiers is tractable since the system only needs to classify Global Candidate Pairs, which are strictly less than all possible pairs of records.

The deduplication software generates sets of Global Candidates by aggregating pairs of records called Local Candidate Pairs, which are candidate pairs according to a local similarity function (based on one attribute). For example if the aggregation function A is the union operator, the software obtains local candidate pairs from $L\_1>T\_1, \ldots, L\_k>T\_k$, and unions the resulting sets to obtain Global Candidate Pairs. In general, multiple similarity criteria can be combined using a Boolean formula in disjunctive normal form (DNF), where each atomic predicate represents a single similarity criterion. One example is (first name similarity >0.9 AND last name similarity >0.8) OR (age similarity >0.7 AND social security number similarity >0.99). DNF aggregation is evaluated by obtaining local candidate pairs, intersecting local sets within each clause, and unioning the sets resulting from all clauses.

In order to generate local candidate pairs, software bins the values using Algorithm 1 or 2. Then, the software performs candidate generation. Two values $v\_i$ and $v\_j$ are candidates if they are binned to two bins $S_i$ and $S_j$ respectively, such that $P(S_i) \subseteq P(S_j) \cup D(S_j)$ and $P(S_j) \subseteq P(S_i) \cup D(S_i)$. This can be done by expanding each entry (P, D) into multiple bin IDs by concatenating P with each subset of D. The resulting bin IDs can be indexed (e.g., using a hash index). The index can then be used to obtain all pairs of values having the same bin ID. Alternatively, the software can create a Trie index where each (state, value) pair is stored with key P(state)∪D(state). Then, for each (state, value) pair, the software probes the index looking for keys that are supersets of P(State), which corresponds to the condition $P(S_i) \subseteq P(S_j) \cup D(S_j)$. Then, the software verifies the second condition $P(S_j) \subseteq P(S_i) \cup D(S_i)$ for the obtained results. Local candidate pairs consist of all record pairs that satisfy both conditions. Since a pair might be generated multiple times as it appears in various bins, duplicate pairs are removed from local candidate pair set.

Experiments

The deduplication system was tested using 400,000 records from Digital Bibliography and Library Project (DBLP) dataset. The algorithms were performed by the computer processors on data records in computer memory. The following approaches were tested:

AP: The algorithm described in "Scaling up all pairs similarity search."

LA2P: A variant of the algorithm described in "L2AP: Fast Cosine Similarity Search With Prefix L-2 Norm Bounds."

BF1: Binning filter using algorithm 1, using frequency threshold of 0.01 (1%). In method 1, the frequency of a particular combination of terms (or state) was approximated using frequency of the least frequent term.

BF2: Binning filter using algorithm 2, using frequency threshold of 0.000078125. In method 2, frequency of a particular combination of terms (or state) was approximated using frequency of each term multiplied together by assuming independence.

Figure 3:
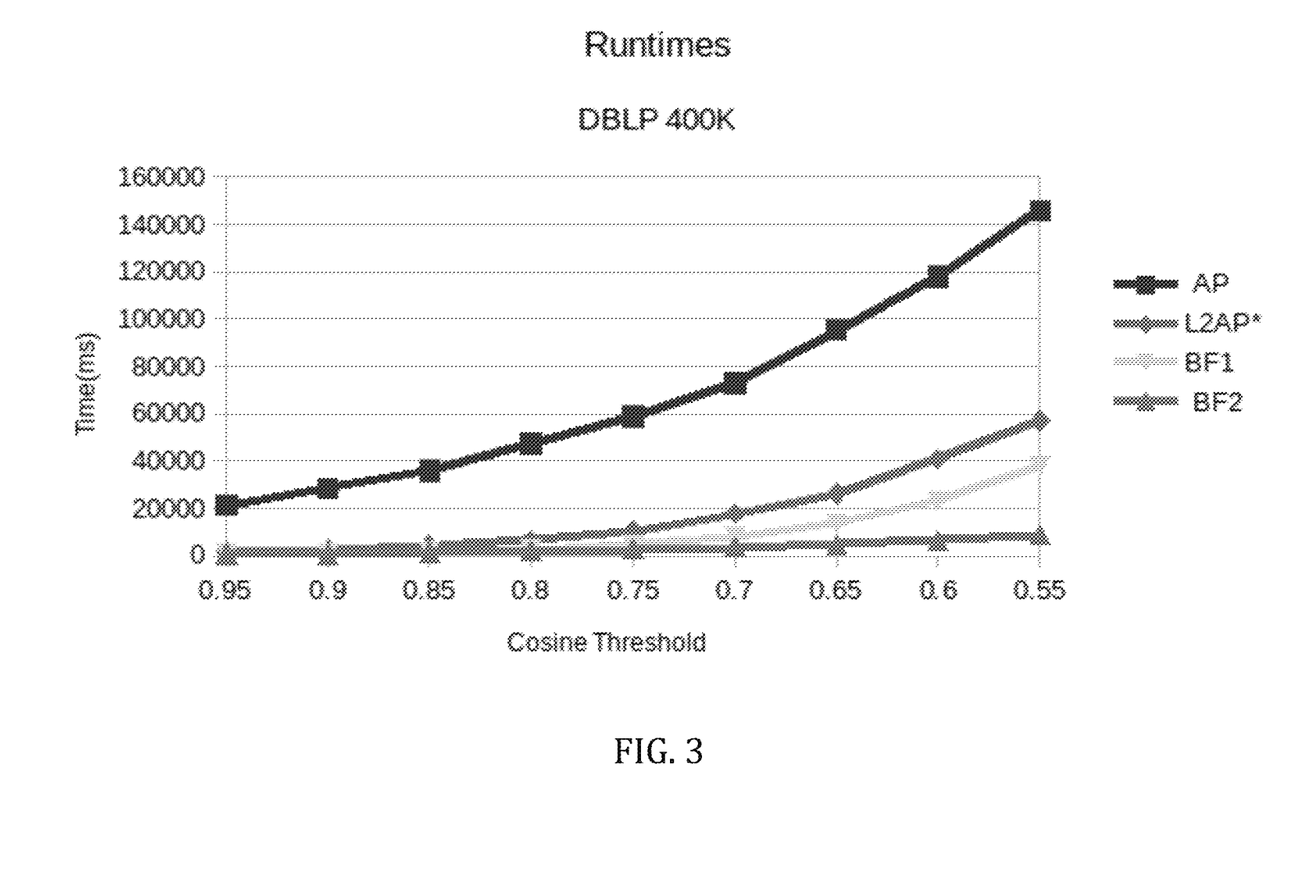
FIG. 3 shows an experimental comparison with previous art.

FIG. 3 shows experimental results indicating the improved performance using BF1 and BF2. All methods were implemented as C++ programs. Experiments were executed on the following machine specs:

Architecture: x86_64
CPU op-mode(s): 32-bit, 64-bit
CPU(s): 12
Thread(s) per core: 1
Core(s) per socket: 6
Socket(s): 2
NUMA node(s): 2
Vendor ID: GenuineIntel
CPU family: 6
Model: 63
Stepping: 2
CPU MHz: 1200.187
BogoMIPS: 3201.22
Virtualization: VT-x
L1d cache: 32K
L1i cache: 32K
L2 cache: 256K
L3 cache: 15360K
NUMA node0 CPU(s): 0-5
NUMA node1 CPU(s): 6-11

OTHER EMBODIMENTS

Given example matches, an optimal candidate generation criteria (e.g., a DNF of local candidate generation functions) is determined such that the maximum number of false negatives is less than a threshold N, and the number of generated candidates is minimal. This is basically a supervised machine learning technique to come up with candidate generation criteria. Alternatively, a user can determine a DNF directly if no matching examples are available, and/or maximum result predictability of candidate generation is desired.

Global Candidate Pairs may be generated holistically without generating the local candidate pairs according to each local similarity function. Multiple local Bin IDs for each record may be generated according to the local similarity functions. The local Bin IDs are then used to calculate Global Bin IDs (e.g., by concatenating the local Bin IDs). The Global Candidate Pairs may be generated from each Global Bin (e.g., the Cartesian Product of all records in a Global Bin).

It is to be understood that the above description is intended to be illustrative, and not restrictive. Many other embodiments will be apparent to those of skill in the art upon reviewing the above description. The scope of invention should, therefore, be determined with reference to the appended claims, along with the full scope of equivalents to which such claims are entitled.

What is claimed is:

1. A computer implemented method for use in fast record deduplication comprising:
    inputting, into software running on one or more computer processors, data records having multiple attributes;
    inputting, into the software, local similarity functions of individual attributes with local similarity thresholds;
    generating, by the software, Bin IDs based on the local similarity functions and the local similarity thresholds;
    identifying local candidate pairs based on data records that share Bin IDs;
    aggregating, by the software, the local candidate pairs to produce a set of global candidate pairs; and
    filtering, by the software, the set of global candidate pairs by deciding whether a pair of data records represents a duplicate,
    wherein the generating and identifying further comprise:
    extracting building blocks from text within an attribute of a data record;
    mapping the extracted building blocks to a global predefined order;
    selecting subsets of the extracted building blocks as Bin IDs;
    repeating the extracting, mapping, and selecting steps for every data record containing one or more text attributes; and
    matching any two data records sharing a same Bin ID as a local candidate pair.

2. A computer implemented method for use in fast record deduplication comprising:
    inputting, into software running on one or more computer processors, data records having multiple attributes;
    inputting, into the software, local similarity functions of individual attributes with local similarity thresholds;
    generating, by the software, Bin IDs based on the local similarity functions and the local similarity thresholds;
    identifying local candidate pairs based on data records that share Bin IDs;
    aggregating, by the software, the local candidate pairs to produce a set of global candidate pairs; and
    filtering, by the software, the set of global candidate pairs by deciding whether a pair of data records represents a duplicate,
    wherein the generating and identifying further comprise:
    creating two sets of numeric bins, where the length of each numeric bin equals two times a threshold, the bins within each set are disjoint and interleaved with overlap equal to the threshold, and assigning a unique Bin ID to each bin in each set;
    mapping a data record having a numeric value to two Bin IDs, one from each of the two sets of numeric bins, based on the first bin being 2*floor (numeric value/ 2*threshold) and the second bin being 2*floor (((numeric value+threshold)/2*threshold)+1);
    repeating the mapping for every data record having a numeric value; and
    matching any two data records sharing a same Bin ID as a local candidate pair.

3. A computer implemented method for use in fast record deduplication comprising:
    inputting, into software running on one or more computer processors, data records having multiple attributes;
    inputting, into the software, local similarity functions of individual attributes with local similarity thresholds;
    generating, by the software, Bin IDs based on the local similarity functions and the local similarity thresholds;
    identifying local candidate pairs by a Cartesian product of all data records sharing a same Bin ID;
    aggregating, by the software, the local candidate pairs to produce a set of global candidate pairs;

filtering, by the software, the set of global candidate pairs by deciding whether a pair of data records represents a duplicate.

4. The method of claim 3, wherein aggregating the local candidate pairs to produce a set of global candidate pairs further comprises:
   intersecting the local candidate pairs to obtain the set of global candidate pairs; or
   unioning the local candidate pairs to obtain the set of global candidate pairs; or
   intersecting the union of the local candidate pairs to obtain the set of global candidate pairs.

5. A computer implemented method for use in fast record deduplication comprising:
   inputting, into software running on one or more computer processors, data records having multiple attributes;
   inputting, into the software, local similarity functions of individual attributes with local similarity thresholds;
   generating, by the software, Bin IDs based on the local similarity functions and the local similarity thresholds;
   identifying local candidate pairs based on data records that share Bin IDs;
   aggregating, by the software, the local candidate pairs to produce a set of global candidate pairs by:
      intersecting the local candidate pairs to obtain the set of global candidate pairs; or
      unioning the local candidate pairs to obtain the set of global candidate pairs; or
      intersecting the union of the local candidate pairs to obtain the set of global candidate pairs; and
   filtering, by the software, the set of global candidate pairs by deciding whether a pair of data records represents a duplicate.

6. A system for performing fast record deduplication comprising at least one non-transitory computer-readable medium containing computer program instructions that when executed by at least one computer processor causes the at least one computer processor to perform the steps of:
   inputting data records having multiple attributes;
   inputting local similarity functions of individual attributes with local similarity thresholds;
   generating Bin IDs based on the local similarity functions and the local similarity thresholds;
   identifying local candidate pairs based on data records that share Bin IDs;
   aggregating the local candidate pairs to produce a set of global candidate pairs; and
   filtering the set of global candidate pairs by deciding whether a pair of data records represents a duplicate,
   wherein the generating and identifying further comprise:
   extracting building blocks from text within an attribute of a data record;
   mapping the extracted building blocks to a global predefined order;
   selecting subsets of the extracted building blocks as Bin IDs;
   repeating the extracting, mapping, and selecting steps for every data record containing one or more text attributes; and
   matching any two data records sharing a same Bin ID as a local candidate pair.

7. A system for performing fast record deduplication comprising at least one non-transitory computer-readable medium containing computer program instructions that when executed by at least one computer processor causes the at least one computer processor to perform the steps of:
   inputting data records having multiple attributes;
   inputting local similarity functions of individual attributes with local similarity thresholds;
   generating Bin IDs based on the local similarity functions and the local similarity thresholds;
   identifying local candidate pairs based on data records that share Bin IDs;
   aggregating the local candidate pairs to produce a set of global candidate pairs; and
   filtering the set of global candidate pairs by deciding whether a pair of data records represents a duplicate,
   wherein the generating and identifying further comprise:
   creating two sets of numeric bins, where the length of each numeric bin equals two times a threshold, the bins within each set are disjoint and interleaved with overlap equal to the threshold, and assigning a unique Bin ID to each bin in each set;
   mapping a data record having a numeric value to two Bin IDs, one from each of the two sets of numeric bins, based on the first bin being 2*floor (numeric value/2*threshold) and the second bin being 2*floor (((numeric value+threshold)/2*threshold)+1);
   repeating the mapping for every data record having a numeric value; and
   matching any two data records sharing a same Bin ID as a local candidate pair.

8. A system for performing fast record deduplication comprising at least one non-transitory computer-readable medium containing computer program instructions that when executed by at least one computer processor causes the at least one computer processor to perform the steps of:
   inputting data records having multiple attributes;
   inputting local similarity functions of individual attributes with local similarity thresholds;
   generating Bin IDs based on the local similarity functions and the local similarity thresholds;
   identifying local candidate pairs by a Cartesian product of all data records sharing a same Bin ID;
   aggregating the local candidate pairs to produce a set of global candidate pairs; and
   filtering the set of global candidate pairs by deciding whether a pair of data records represents a duplicate.

9. The system of claim 8, wherein aggregating the local candidate pairs to produce a set of global candidate pairs further comprises:
   intersecting the local candidate pairs to obtain the set of global candidate pairs; or
   unioning the local candidate pairs to obtain the set of global candidate pairs; or
   intersecting the union of the local candidate pairs to obtain the set of global candidate pairs.

10. A system for performing fast record deduplication comprising at least one non-transitory computer-readable medium containing computer program instructions that when executed by at least one computer processor causes the at least one computer processor to perform the steps of:
    inputting data records having multiple attributes;
    inputting local similarity functions of individual attributes with local similarity thresholds;
    generating Bin IDs based on the local similarity functions and the local similarity thresholds;
    identifying local candidate pairs based on data records that share Bin IDs;
    aggregating the local candidate pairs to produce a set of global candidate pairs by:
       intersecting the local candidate pairs to obtain the set of global candidate pairs; or unioning the local candidate pairs to obtain the set of global candidate pairs; or intersecting the union of the local candidate pairs to obtain the set of global candidate pairs; and filtering the set of global candidate pairs by deciding whether a pair of data records represents a duplicate.

\* \* \* \* \*